US012704527B2

(12) United States Patent
Ahn et al.

(10) Patent No.: US 12,704,527 B2
(45) Date of Patent: Aug. 11, 2026

(54) INSPECTION DEVICE USING ELECTRICALLY CONDUCTIVE CONTACT PIN

(71) Applicant: POINT ENGINEERING CO., LTD., Chungcheongnam-do (KR)

(72) Inventors: Bum Mo Ahn, Gyeonggi-do (KR); Seung Ho Park, Gyeonggi-do (KR); Chang Hee Hong, Gyeonggi-do (KR)

(73) Assignee: POINT ENGINEERING CO., LTD., Chungcheongnam-do (KR)

( * ) Notice: Subject to any disclaimer, the term of this patent is extended or adjusted under 35 U.S.C. 154(b) by 186 days.

(21) Appl. No.: 18/710,173

(22) PCT Filed: Nov. 8, 2022

(86) PCT No.: PCT/KR2022/017464
§ 371 (c)(1),
(2) Date: May 14, 2024

(87) PCT Pub. No.: WO2023/090746
PCT Pub. Date: May 25, 2023

(65) Prior Publication Data

US 2025/0035670 A1 Jan. 30, 2025

(30) Foreign Application Priority Data

Nov. 17, 2021 (KR) ........................ 10-2021-0158767

(51) Int. Cl.
*G01R 1/067* (2006.01)

(52) U.S. Cl.
CPC ..... *G01R 1/06716* (2013.01); *G01R 1/06733* (2013.01); *G01R 1/06761* (2013.01)

(58) Field of Classification Search
CPC ............ G01R 1/06716; G01R 1/06733; G01R 1/06761; G01R 1/067; G01R 1/06722
See application file for complete search history.

(56) References Cited

U.S. PATENT DOCUMENTS 4,773,877 A * 9/1988 Kruger ............... H01R 13/2428 324/755.05
5,667,410 A * 9/1997 Johnston ............ G01R 1/06722 324/755.05

(Continued)

FOREIGN PATENT DOCUMENTS

CN 101911273 12/2010
CN 111610353 9/2020

(Continued)

OTHER PUBLICATIONS

Original and Translation of JP2017130421 (Year: 2017).*

(Continued)

*Primary Examiner* — Timothy J. Dole
*Assistant Examiner* — Muhammed Azam
(74) *Attorney, Agent, or Firm* — JCIPRNET

(57) ABSTRACT

An electrically conductive contact pin includes a first connection portion, a second connection portion, a pair of support portions, a first elastic portion, and a second elastic portion, and is characterized in that a first connection portion contacts the pair of support portions to form a current path when a first elastic portion is compressed, and the second connection portion contacts the pair of support portions to form a current path when the second elastic portion is compressed. An inspection device comprises an installation member having a through hole for receiving the electrically conductive contact pin.

12 Claims, 13 Drawing Sheets

(56) References Cited

U.S. PATENT DOCUMENTS

| | | | | | |
|---|---|---|---|---|---|
| 6,083,059 | A * | 7/2000 | Kuan | H01R 13/2428 439/700 |
| 6,358,097 | B1 * | 3/2002 | Peters | H01R 13/2428 439/700 |
| 6,471,524 | B1 * | 10/2002 | Nakano | H01R 13/2428 439/70 |
| 6,626,708 | B2 * | 9/2003 | Phillips | H01R 13/2428 439/700 |
| 10,044,127 | B2 * | 8/2018 | Hachuda | H01R 13/2428 |
| 12,546,812 | B2 * | 2/2026 | Ahn | G01R 1/07357 |
| 2002/0048973 | A1 * | 4/2002 | Zhou | G01R 1/06711 257/E23.021 |
| 2002/0142669 | A1 * | 10/2002 | Phillips | H01R 13/2428 439/700 |
| 2005/0110505 | A1 * | 5/2005 | Stanley Tsui | G01R 1/06733 324/755.05 |
| 2010/0285698 | A1 * | 11/2010 | Lee | G01R 1/06722 439/786 |
| 2015/0192617 | A1 | 7/2015 | Liu et al. | |
| 2017/0244189 | A1 | 8/2017 | Foong et al. | |
| 2019/0242926 | A1 * | 8/2019 | Sasano | G01R 1/06716 |
| 2020/0158753 | A1 * | 5/2020 | Teranishi | G09G 3/006 |
| 2021/0148950 | A1 | 5/2021 | Hwang et al. | |
| 2023/0358785 | A1 * | 11/2023 | Veeramani | G01R 1/07314 |
| 2024/0118335 | A1 * | 4/2024 | Ahn | G01R 1/07357 |
| 2024/0159795 | A1 * | 5/2024 | Ahn | G01R 1/0466 |
| 2024/0426871 | A1 * | 12/2024 | Ahn | G01R 1/06716 |
| 2024/0426872 | A1 * | 12/2024 | Ahn | G01R 3/00 |
| 2025/0020690 | A1 * | 1/2025 | Ahn | G01R 1/07357 |
| 2025/0035670 | A1 * | 1/2025 | Ahn | G01R 1/06733 |
| 2025/0180603 | A1 * | 6/2025 | Ahn | G01R 1/06716 |
| 2025/0199032 | A1 * | 6/2025 | Ahn | G01R 1/067 |
| 2025/0306089 | A1 * | 10/2025 | Ahn | G01R 31/2887 |
| 2025/0357694 | A1 * | 11/2025 | Ahn | G01R 1/06755 |
| 2025/0389753 | A1 * | 12/2025 | Ahn | G01R 1/06722 |
| 2026/0056232 | A1 * | 2/2026 | Ahn | G01R 1/06733 |

FOREIGN PATENT DOCUMENTS

| | | | |
|---|---|---|---|
| JP | 2010532908 | 10/2010 | |
| JP | 2017036959 | 2/2017 | |
| KR | 100659944 | 12/2006 | |
| KR | 1020080112696 | 12/2008 | |
| KR | 100952712 | 4/2010 | |
| KR | 20170036511 | 4/2017 | |
| KR | 101799309 | 12/2017 | |
| KR | 101860519 | 5/2018 | |
| KR | 20180095315 | 8/2018 | |
| KR | 1020200104061 | 9/2020 | |
| KR | 102166677 | 10/2020 | |
| KR | 102166677 B1 * | 10/2020 | G01R 1/06722 |
| KR | 102197313 | 12/2020 | |
| WO | 2018162343 | 9/2018 | |

OTHER PUBLICATIONS

Original and Translation of TW200821584 (Year: 2008).*

Original and Translation of JP-WO2019138507 (Year: 2019).*

“International Search Report (Form PCT/ISA/210) of PCT/KR2022/017464”, mailed on Feb. 8, 2023, with English translation thereof, pp. 1-4.

“Office Action of Korea Counterpart Application”, issued on Jun. 12, 2024, with English translation thereof, p. 1-p. 6.

“Notification of Review Opinions of Taiwan Counterpart Application, Application No. 111143389”, issued on Jan. 21, 2026, with English translation thereof, p. 1-p. 12.

* cited by examiner

INSPECTION DEVICE USING ELECTRICALLY CONDUCTIVE CONTACT PIN

CROSS-REFERENCE TO RELATED APPLICATION

This application is a 371 application of the International PCT application serial no. PCT/KR2022/017464, filed on Nov. 8, 2022, which claims the priority benefits of Korean Patent Application No. 10-2021-0158767, filed on Nov. 17, 2021. Each of the entirety of the above-mentioned patent applications is hereby incorporated by reference herein and made a part of this specification.

TECHNICAL FIELD

The present disclosure relates to an electrically conductive contact pin and an inspection device having the same.

BACKGROUND ART

A test for electrical characteristics of a semiconductor device is performed by approaching an inspection object (semiconductor wafer or semiconductor package) to an inspection device having a plurality of electrically conductive contact pins and then bringing the respective electrically conductive contact pins into contact with corresponding external terminals (solder balls or bumps) on the inspection object. Examples of inspection devices include, but are not limited to, probe cards or test sockets.

Conventional test sockets include a pogo-type socket and a rubber-type socket.

An electrically conductive contact pin (hereinafter referred to as a "pogo-type socket pin") used in the pogo-type test socket includes a pin portion and a barrel accommodating the pin portion. The pin portion is provided with a spring member between plungers at opposite ends of the pin portion to enable application of required contact pressure and shock absorption at a contact position. In order for the pin portion to slide within the barrel, a gap has to exist between an outer surface of the pin portion and an inner surface of the barrel. However, since the pogo-type socket pin is used by separately manufacturing the barrel and the pin portion and then assembling them together, the gap between the outer surface of the pin portion and the inner surface of the barrel is increased more than necessary, so it is impossible to precisely manage the gap. Therefore, electrical signals are lost and distorted in the process of being transferred to the barrel via the opposite plungers, causing a problem in that contact stability is not constant. In addition, the pin portion has a pointed tip portion to increase the contact effect with an external terminal of an inspection object. The pointed tip portion generates a mark or a groove due to press-contact on the external terminal of the inspection object after inspection. The loss of the contact shape of the external terminal causes an error in vision test and lowers the reliability of the external terminal in a subsequent process such as soldering.

Meanwhile, an electrically conductive contact pin (hereinafter referred to as a "rubber-type socket pin") used in a rubber-type test socket has a structure in which conductive microballs are disposed inside a silicon rubber made of a rubber material. When stress is applied by placing an inspection object (e.g., a semiconductor package) and closing the socket, conductive microballs made of gold strongly press each other and increase conductivity, making the microballs electrically connected. However, the rubber-type socket pin has a problem in that contact stability is secured only when the socket pin is pressed with an excessive pressing force.

Meanwhile, with the advancement and high integration of semiconductor technology, the pitch of the external terminals of the inspection object has become narrower. In the case of the rubber-type socket pin, the socket pin is produced by preparing a molding material in which conductive particles are distributed in a fluid elastic material, inserting the molding material into a predetermined mold, and applying a magnetic field in the thickness direction to arrange the conductive particles in the thickness direction. Due to this manufacturing technique, when the distance between magnetic fields is narrowed, the conductive particles are irregularly oriented and a signal flows in the plane direction. Thus, the conventional rubber-type socket pin has limitations in responding to the trend toward narrow pitch technology.

In addition, since the pogo-type socket pin is used by separately manufacturing the barrel and the pin portion and then assembling them together, it is difficult to manufacture the socket pin in a small size. Thus, the pogo-type socket pin also has limitations in responding to the trend toward narrow pitch technology.

Accordingly, there is a need to develop a new type of electrically conductive contact pin and an inspection device having the same that can improve the inspection reliability of inspection for an inspection object to enable compliance with the recent technology trend.

DOCUMENTS OF RELATED ART

Patent Documents (Patent Document 1) Korean Patent No. 10-0659944
(Patent Document 2) Korean Patent No. 10-0952712

DISCLOSURE

Technical Problem

Accordingly, the present disclosure has been made keeping in mind the above problems occurring in the related art, and an objective of the present disclosure is to provide an electrically conductive contact pin and an inspection device that improve inspection reliability for an inspection object.

Technical Solution

In order to accomplish the above objective, according to one aspect of the present disclosure, there is provided an electrically conductive contact pin, including: a first connection portion; a second connection portion; a pair of support portions extending in a length direction; a boundary portion extending in a width direction and having opposite sides connected to the support portions; a first elastic portion connecting the first connection portion and the boundary portion to each other; and a second elastic portion connecting the second connection portion and the boundary portion to each other. The first connection portion may be brought into contact with the support portions to form a current path as the first elastic portion is compressed, and the second connection portion may be brought into contact with the support portions to form a current path as the second elastic portion is compressed.

In addition, the second connection portion may include a pair of flanges located inside the support portions. The flanges may be brought into contact with inner sides of the support portions as the second elastic portion is compressed.

In addition, the first connection portion may include: a base portion connected to the first elastic portion; and at least two protruding portions extending from the base portion.

In addition, the first connection portion may further include a groove provided between the two protruding portions.

In addition, the first elastic portion may include: a first-first elastic portion having a first end connected to the first connection portion and a second end connected to the boundary portion; and a first-second elastic portion disposed to be spaced apart from the first-first elastic portion and having a first end connected to the first connection portion and a end connected to the boundary portion.

In addition, the first-first elastic portion and the first-second elastic portion may have symmetrical shapes in left and right directions.

In addition, each of the support portions may include: a first locking portion provided at a first end thereof; and a second locking portion provided at a second end thereof.

In addition, the electrically conductive contact pin may be formed by stacking a plurality of metal layers in a thickness direction of the electrically conductive contact pin.

In addition, the electrically conductive contact pin may further include: a plurality of fine trenches provided in a side surface thereof.

Meanwhile, according to another aspect of the present disclosure, there is provided an inspection device, including: an electrically conductive contact pin including a first connection portion, a second connection portion, a pair of support portion extending in a length direction, a boundary portion extending in a width direction and having opposite sides connected to the support portions, a first elastic portion connecting the first connection portion and the boundary portion to each other, and a second elastic portion connecting the second connection portion and the boundary portion to each other, wherein the first connection portion is brought into contact with the support portions to form a current path as the first elastic portion is compressed, and the second connection portion is brought into contact with the support portions to form a current path as the second elastic portion is compressed; and an installation member having a through-hole receiving the electrically conductive contact pin.

In addition, each of the support portions may be formed to have a longer length than the through-hole, so that at least a portion of the support portion may protrude out of the through-hole.

In addition, each of the support portions may include: a first locking portion provided at a first end thereof; and a second locking portion provided at a second end thereof.

Advantageous Effects

The present disclosure can provide an electrically conductive contact pin and an inspection device that improve inspection reliability for an inspection object.

MODE FOR INVENTION

Figure 1:
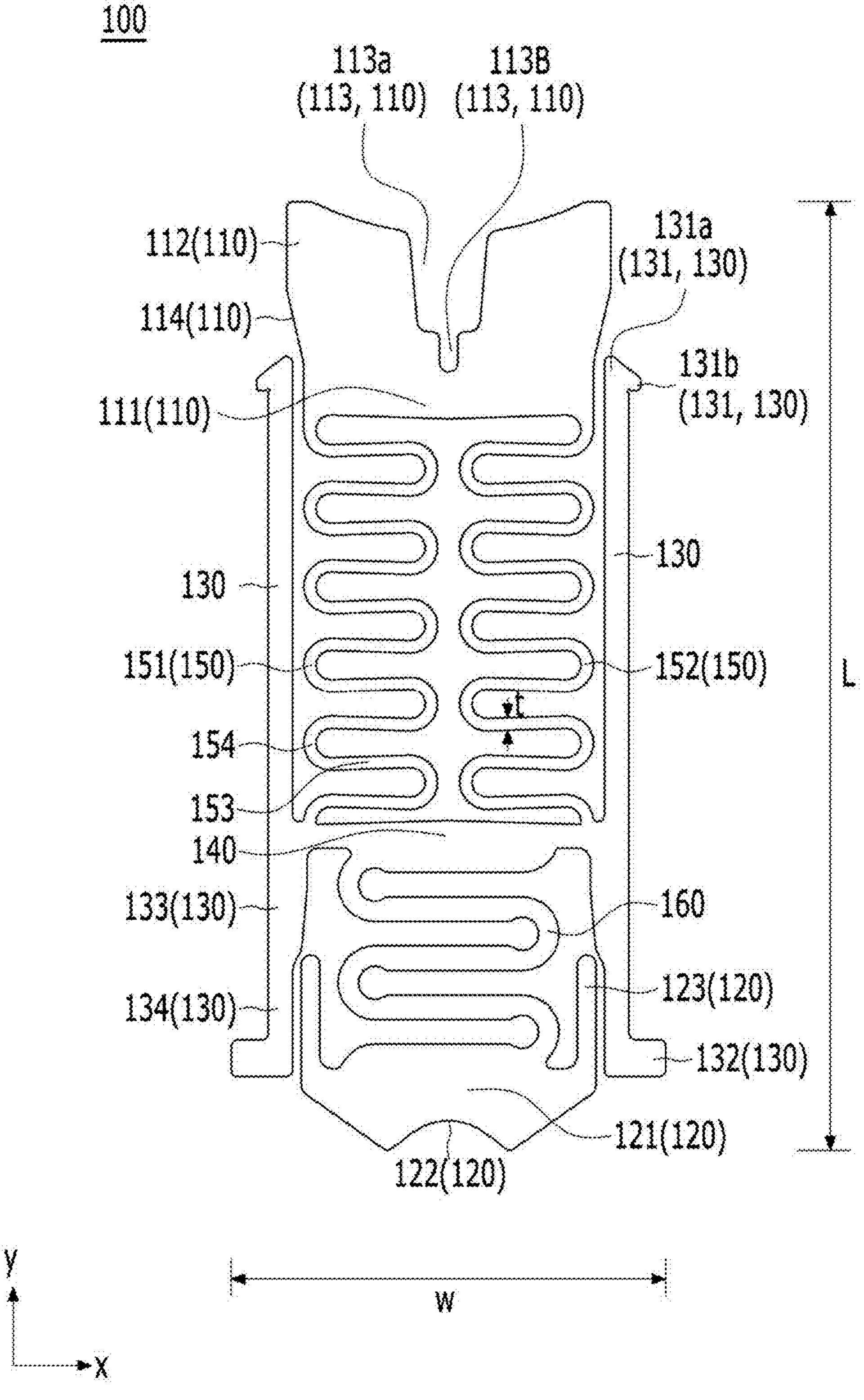
FIG. 1 is a plan view illustrating an electrically conductive contact pin according to a preferred embodiment of the present disclosure.

Contents of the description below merely exemplify the principle of the present disclosure. Therefore, those of ordinary skill in the art may implement the theory of the present disclosure and invent various apparatuses which are included within the concept and the scope of the present disclosure even though it is not clearly explained or illustrated in the description. Furthermore, in principle, all the conditional terms and embodiments listed in this description are clearly intended for the purpose of understanding the concept of the present disclosure, and one should understand that the present disclosure is not limited to the exemplary embodiments and the conditions.

The above described objectives, features, and advantages will be more apparent through the following detailed description related to the accompanying drawings, and thus those of ordinary skill in the art may easily implement the technical spirit of the present disclosure.

The embodiments of the present disclosure will be described with reference to cross-sectional views and/or perspective views which schematically illustrate ideal embodiments of the present disclosure. For explicit and convenient description of the technical content, thicknesses of films and regions in the figures may be exaggerated. As such, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. The technical terms used herein are for the purpose of describing particular embodiments only and should not be construed as limiting the present disclosure. As used herein, the singular forms are intended to include the plural forms as well, unless the context clearly indicates otherwise. It will be further understood that the terms "comprise" or "include" when used herein, specify the presence of stated features, integers, steps, operations, elements, components, and/or combinations thereof but do not preclude the presence or addition of one or more other features, integers, steps, operations, elements, components, and/or combinations thereof.

Hereinafter, preferred embodiments of the present disclosure will be described in detail with reference to the accompanying drawings. Wherever possible, the same reference numerals will be used throughout different embodiments and the description to refer to the same or like elements or parts. In addition, the configuration and operation already described in other embodiments will be omitted for convenience.

Figure 2:
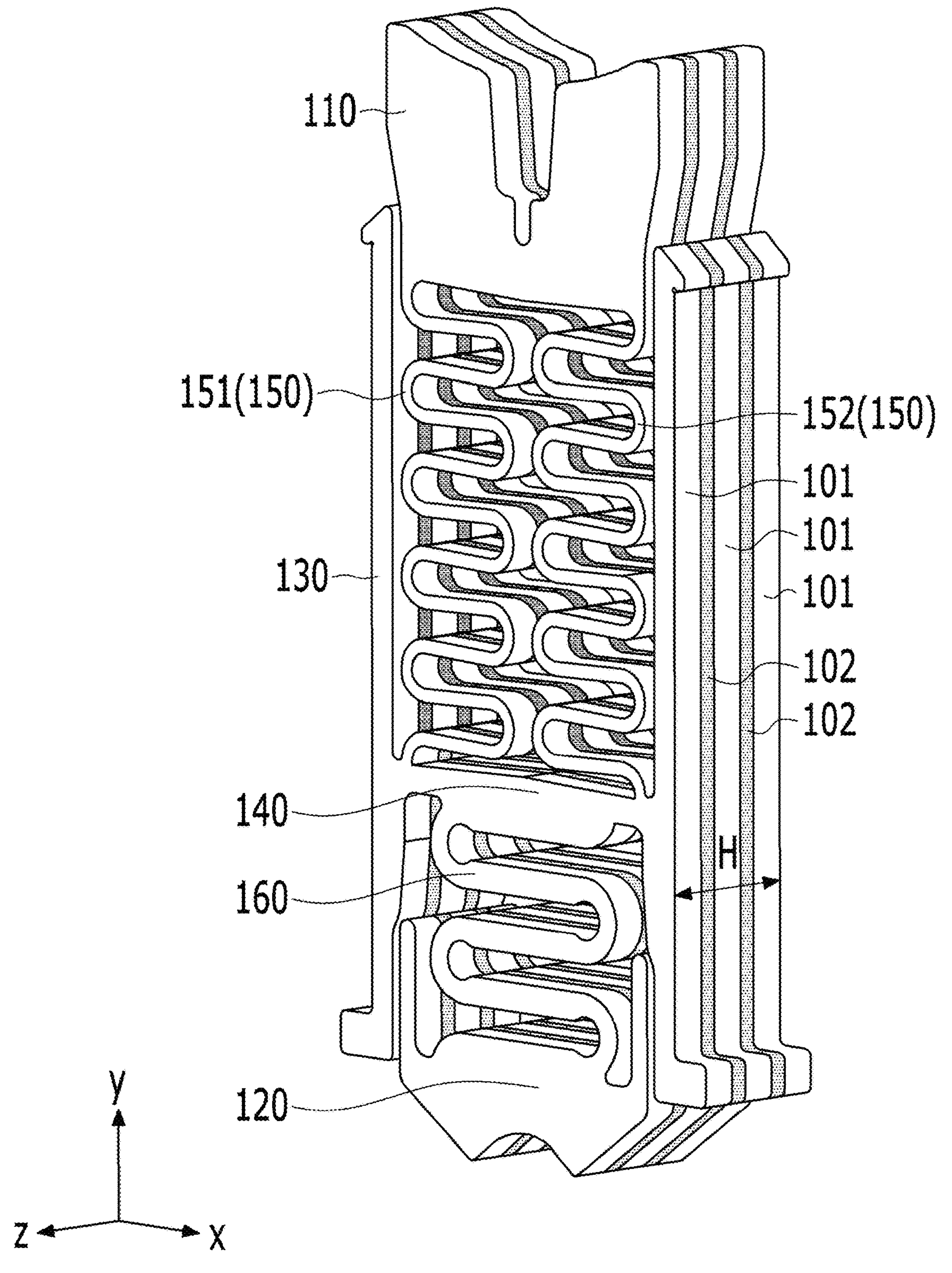
FIG. 2 a perspective view illustrating the electrically conductive contact pin according to the preferred embodiment of the present disclosure.
Figure 3:
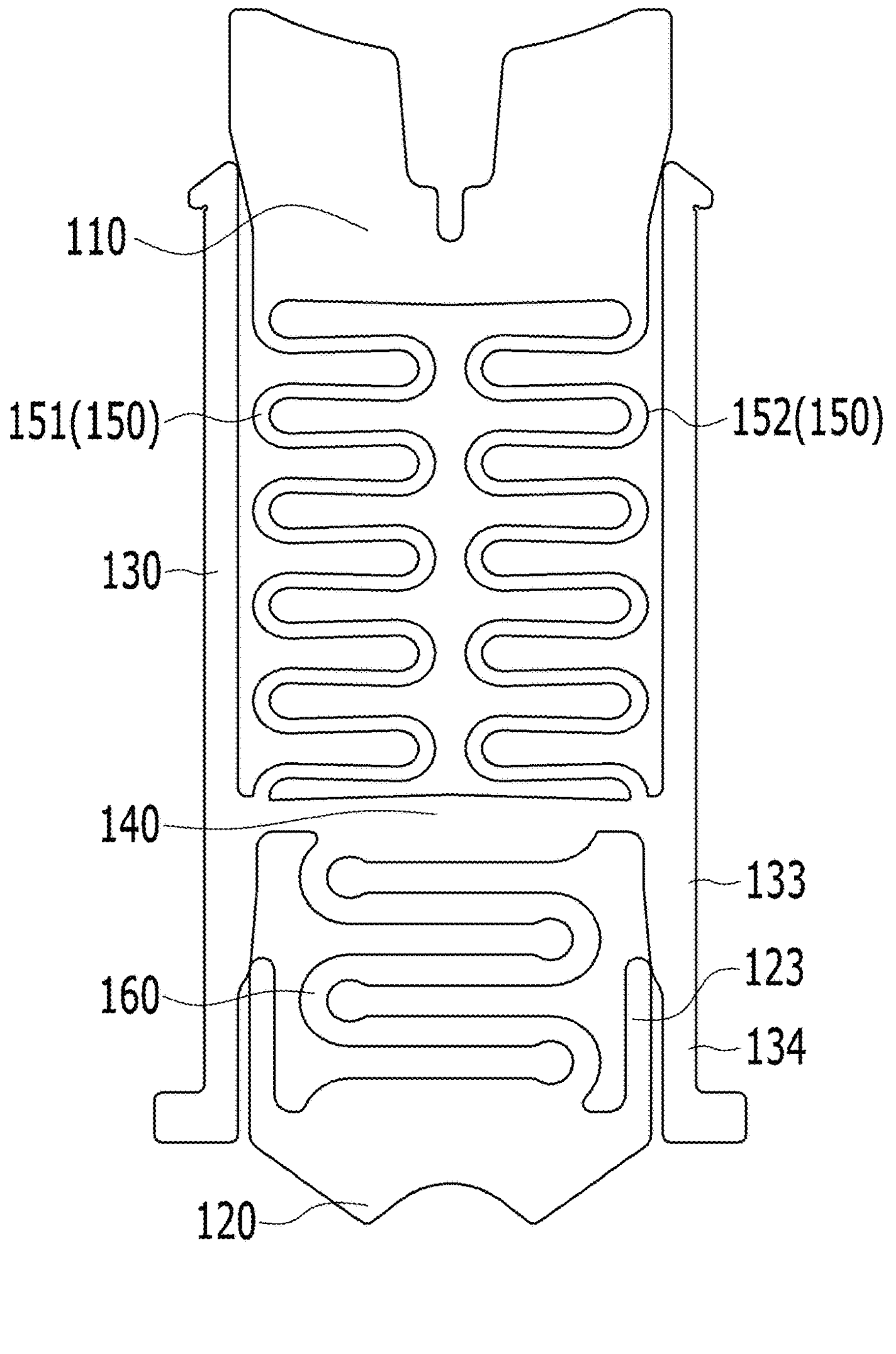
FIG. 3 is a view illustrating current paths of the electrically conductive contact pin according to a preferred embodiment of the present disclosure.
Figure 4:
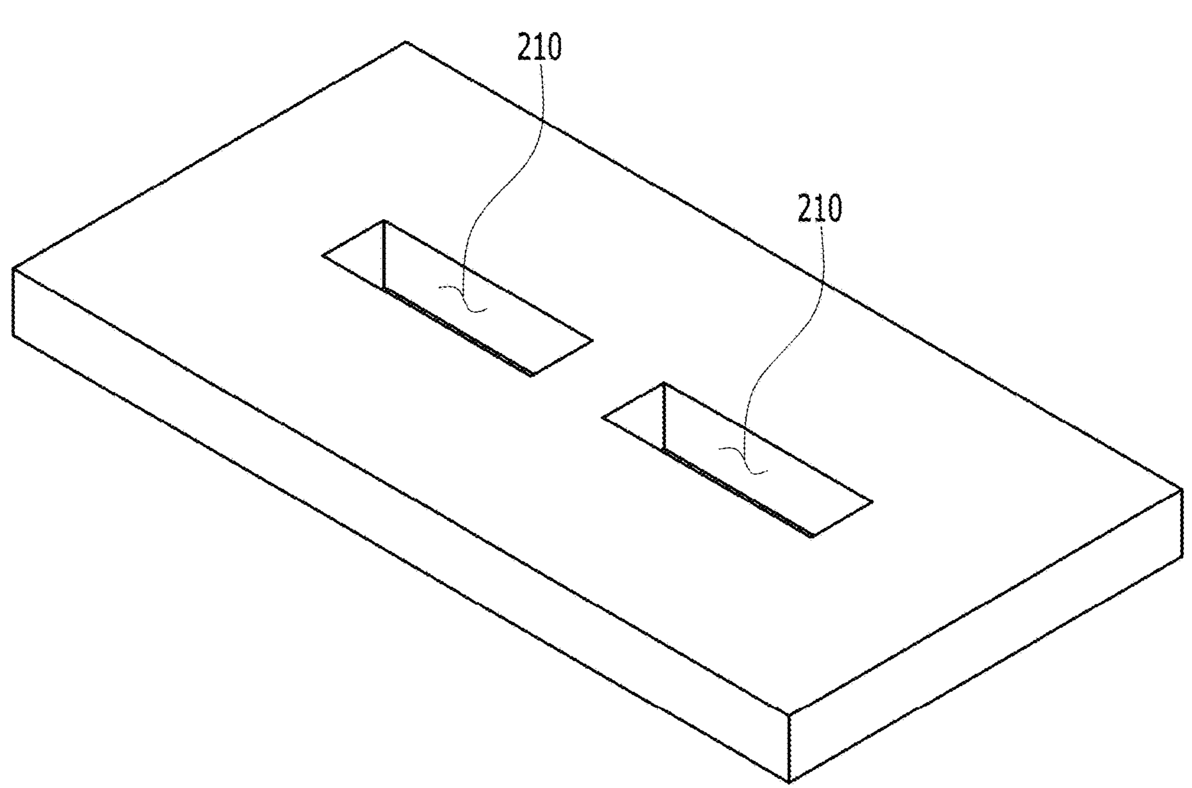
FIG. 4 is a perspective view illustrating an installation member according to the preferred embodiment of the present disclosure.
Figure 5:
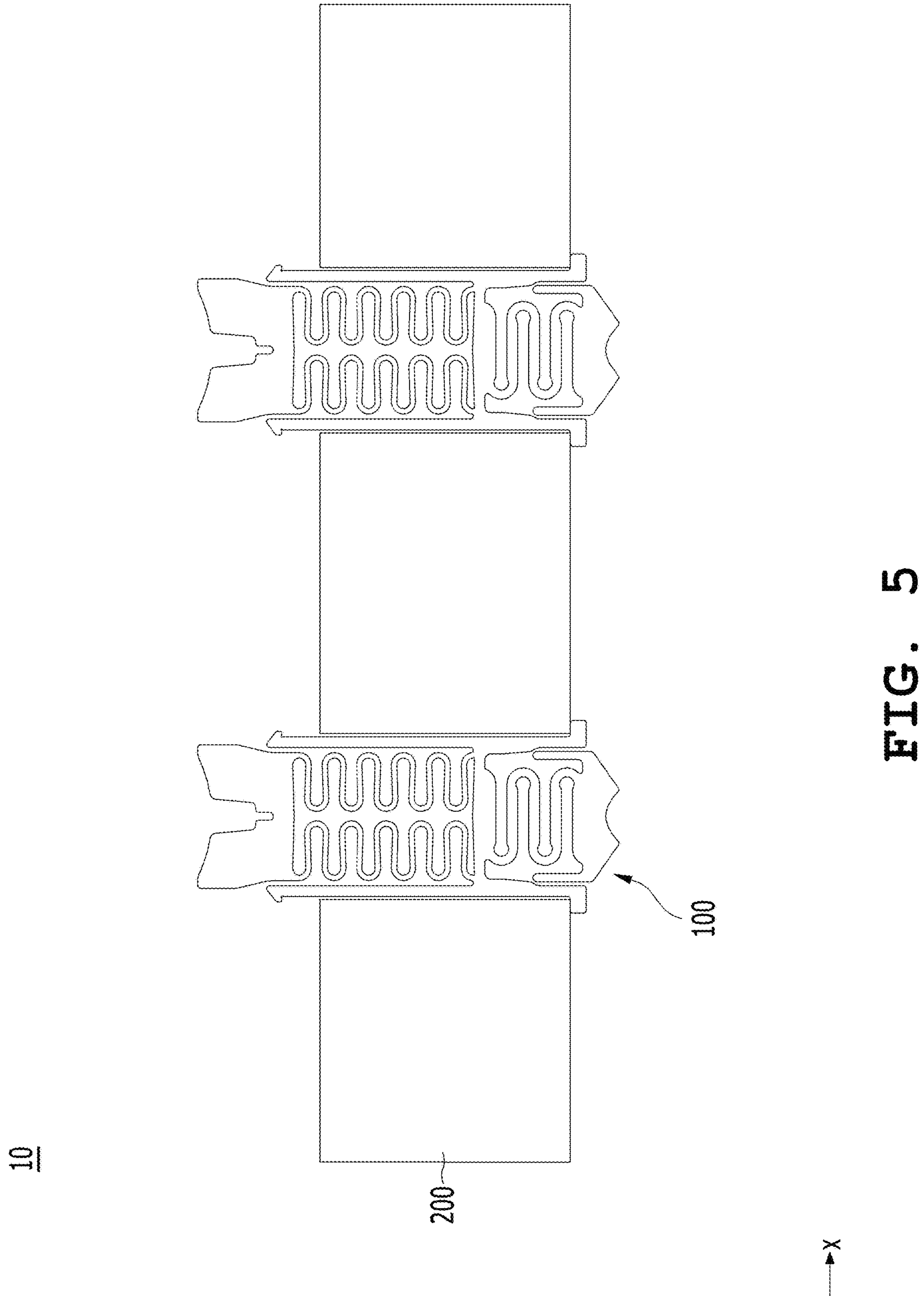
FIG. 5 is a view illustrating electrically conductive contact pins are installed in the installation member according to the preferred embodiment of the present disclosure.
Figure 6:
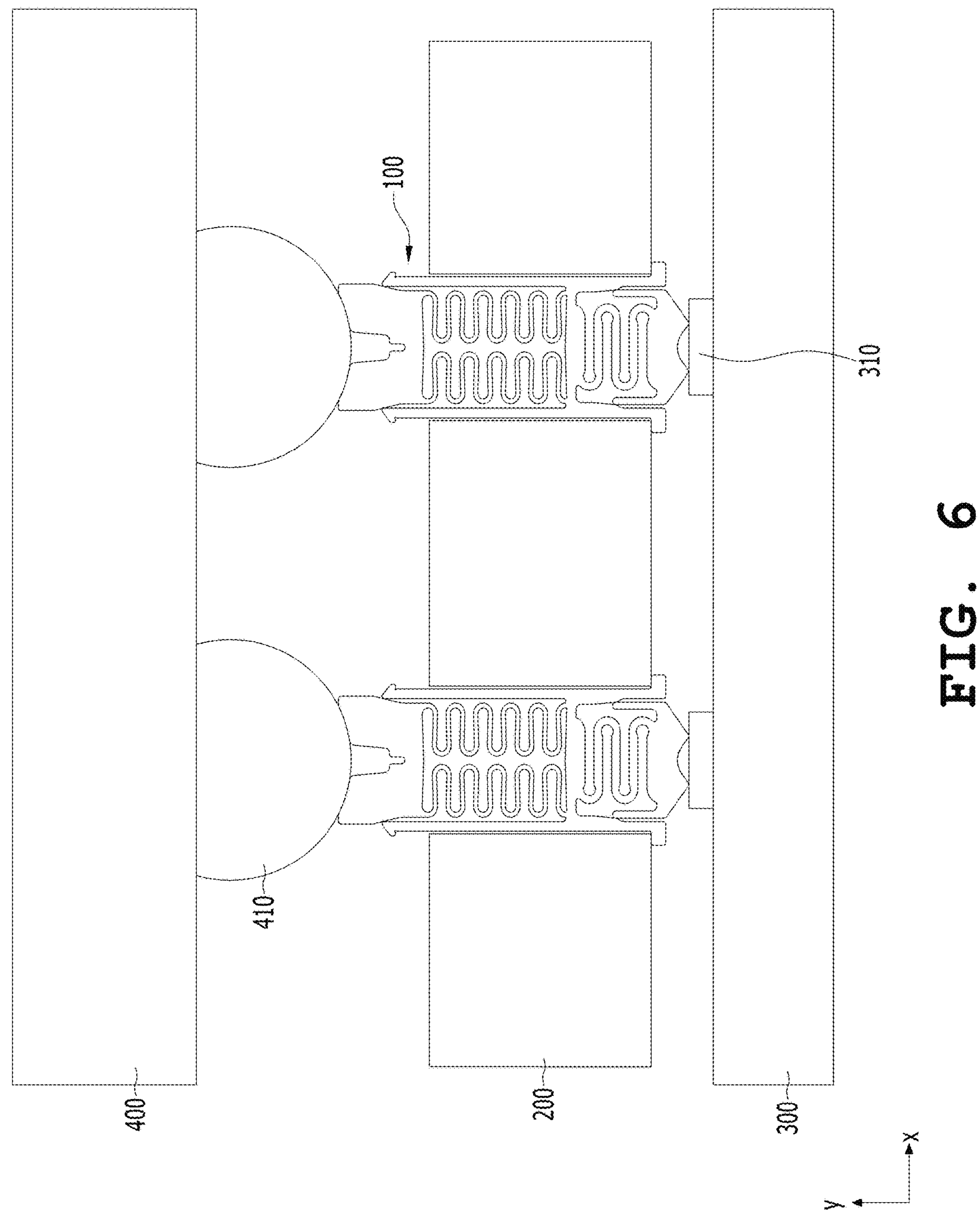
FIG. 6 is a diagram view illustrating an inspection object is inspected using an inspection device according to a preferred embodiment of the present disclosure.
Figure 7:
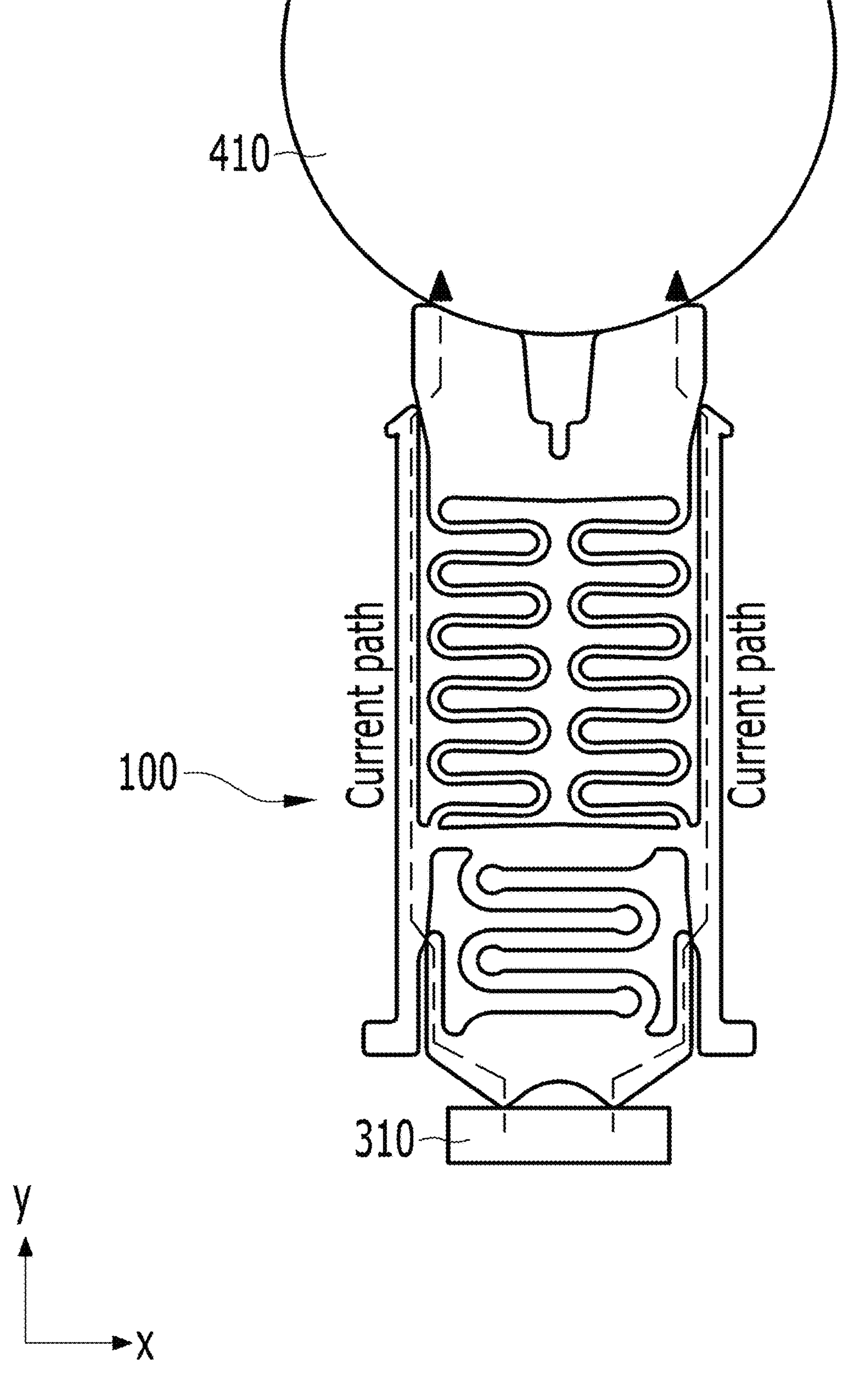
FIGS. 7 and 8 are views illustrating the electrically conductive contact pin according to the preferred embodiment of the present disclosure.
Figure 8:
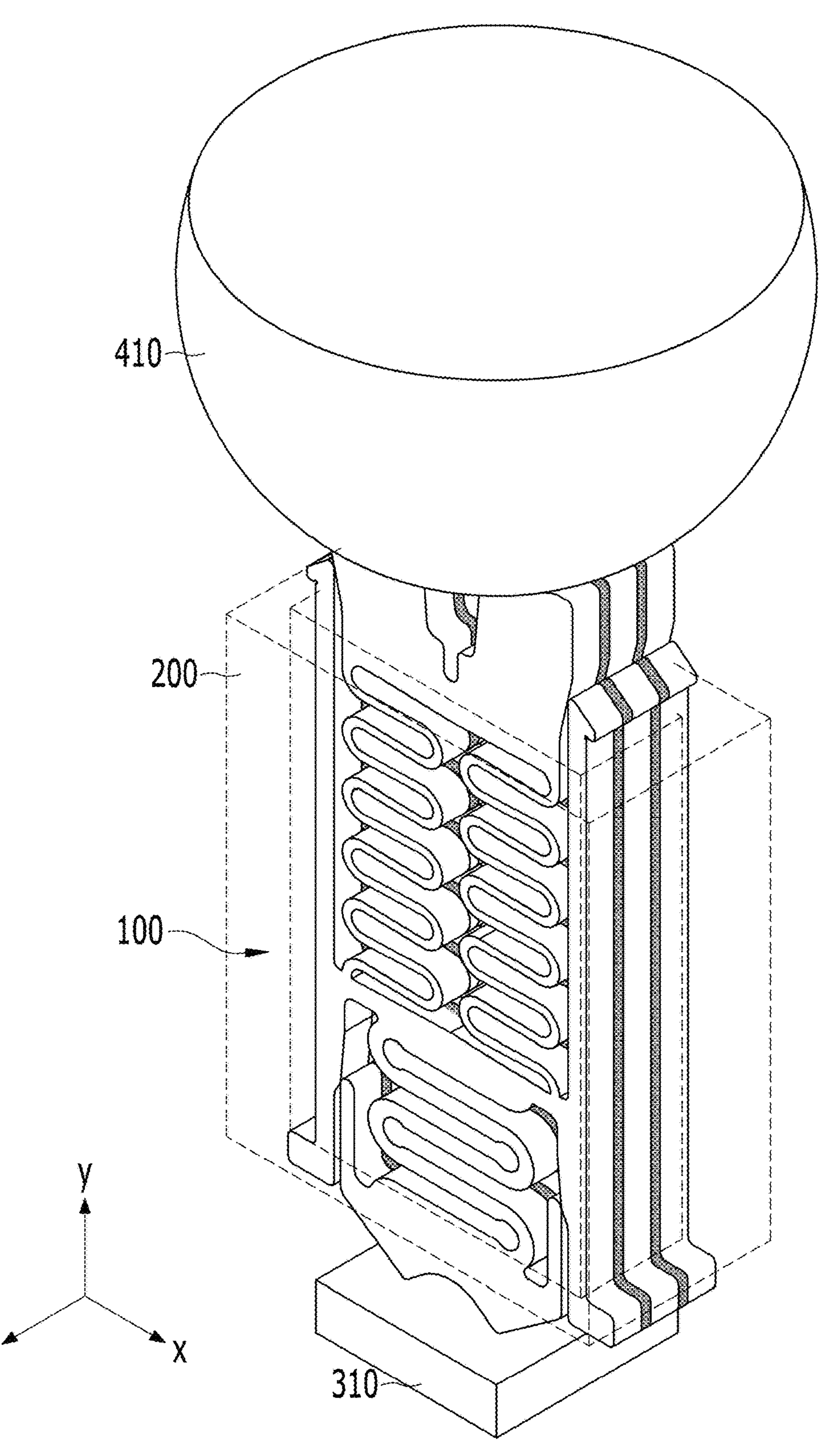
Figure 9A:
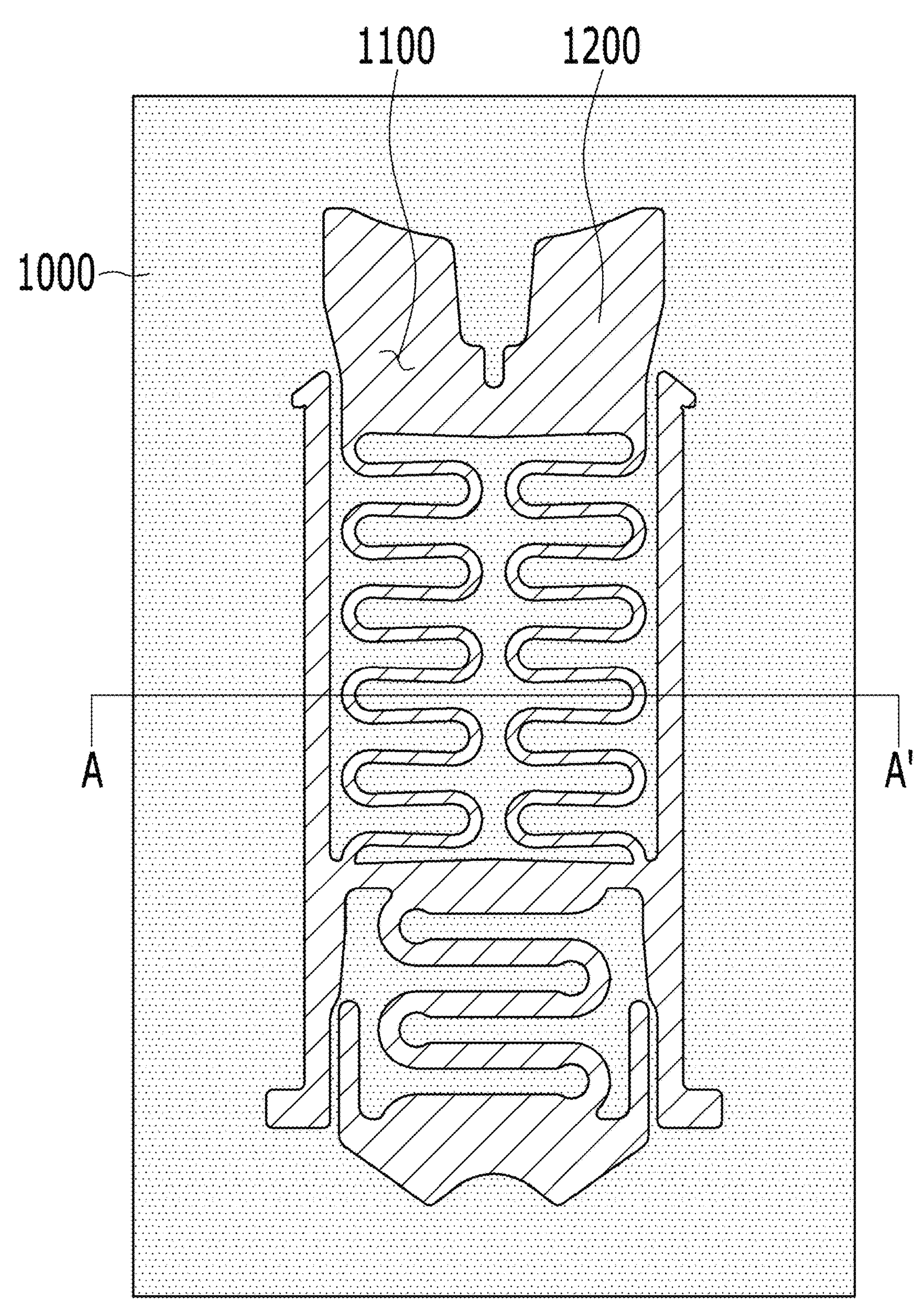
FIGS. 9*a* to 9*d* are views illustrating a method of manufacturing the electrically conductive contact pin according to the preferred embodiment of the present disclosure.
Figure 9B:
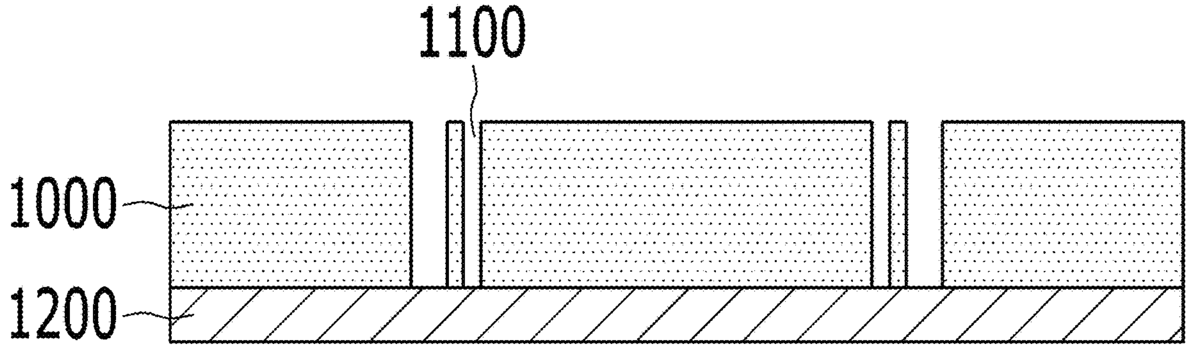
Figure 9C:
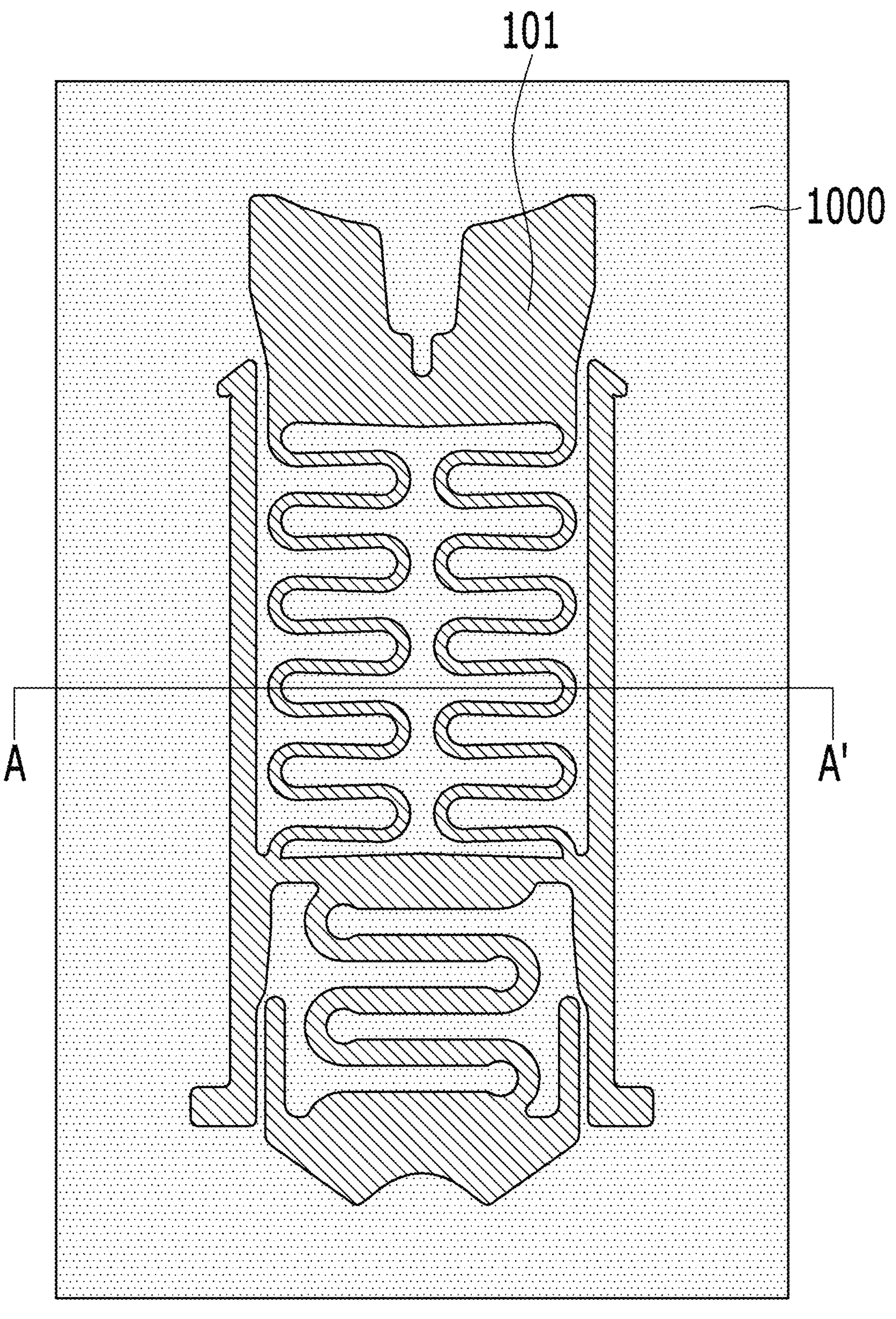
Figure 9D:
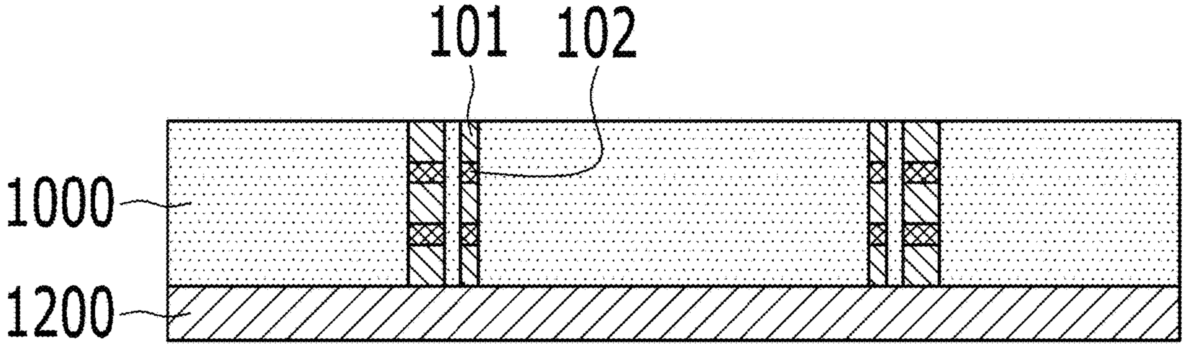
Figure 10:
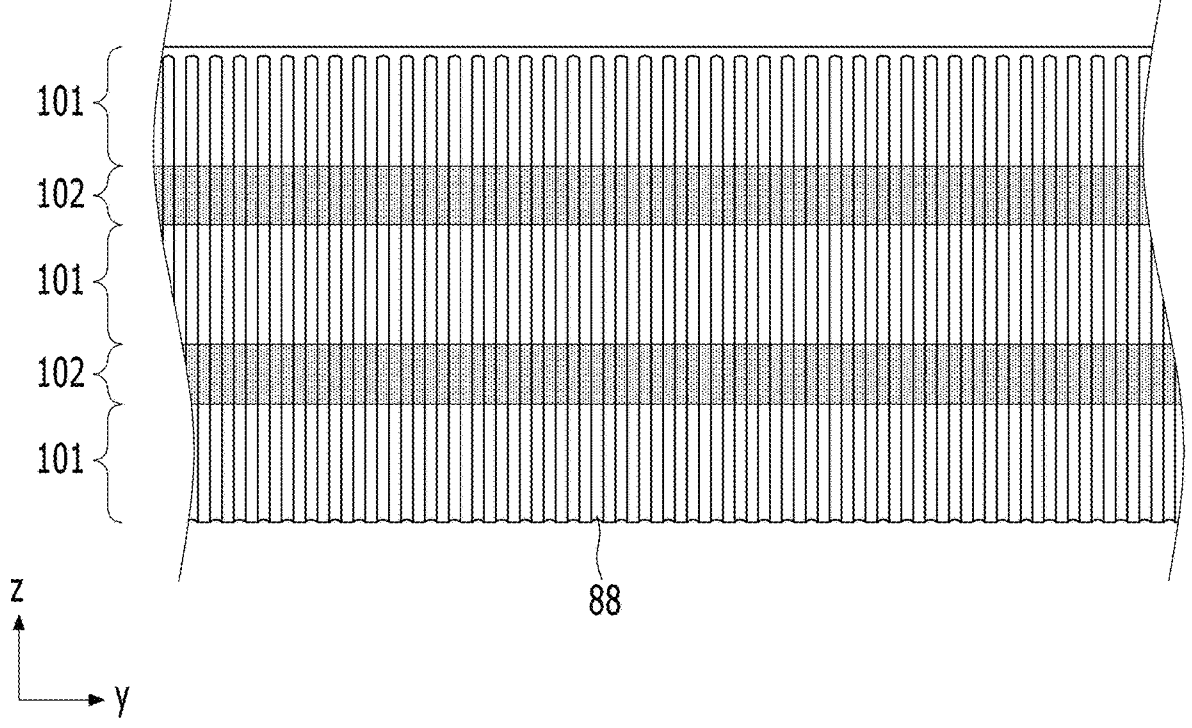
FIG. 10 is a side view illustrating the electrically conductive contact pin according to the preferred embodiment of the present disclosure.

FIG. 1 is a plan view illustrating an electrically conductive contact pin according to a preferred embodiment of the present disclosure. FIG. 2 is a perspective view illustrating the electrically conductive contact pin according to the preferred embodiment of the present disclosure. FIG. 3 is a view illustrating current paths of the electrically conductive contact pin according to a preferred embodiment of the present disclosure. FIG. 4 is a perspective view illustrating an installation member according to the preferred embodiment of the present disclosure. FIG. 5 is a view illustrating electrically conductive contact pins are installed in the installation member according to the preferred embodiment of the present disclosure. FIG. 6 is a diagram view illustrating an inspection object is inspected using an inspection device according to a preferred embodiment of the present disclosure. FIGS. 7 and 8 are views illustrating the electrically conductive contact pin according to the preferred embodiment of the present disclosure. FIGS. 9*a* to 9*d* are views illustrating a method of manufacturing the electrically conductive contact pin according to the preferred embodiment of the present disclosure. FIG. 10 is a side view illustrating the electrically conductive contact pin according to the preferred embodiment of the present disclosure.

The electrically conductive contact pin 100 according to the preferred embodiment of the present disclosure is provided in an inspection device 10 and is used to transmit electrical signals by making electrical and physical contact with an inspection object 400. The inspection device 10 may be an inspection device used in a semiconductor manufacturing process, for example, a probe card or a test socket.

The inspection device 10 includes the electrically conductive contact pin 100 and the installation member 200 having a through-hole for receiving the electrically conductive contact pin 100.

The electrically conductive contact pin 100 may be a probe pin provided in the probe card or a socket pin provided in the test socket. In the following, the socket pin will be exemplified and described as an example of the electrically conductive contact pin 100. However, the electrically conductive contact pin 100 according to the preferred embodiment of the present disclosure is not limited thereto and includes any pin for checking whether the inspection object is defective by applying 400 electricity.

In the following description, the width direction of the electrically conductive contact pin 100 refers to the ±x direction indicated in the drawings, the length direction of the electrically conductive contact pin 100 refers to the ±y direction indicated in the drawings, and the thickness direction of the electrically conductive contact pin 100 refers to the ±z direction indicated in the drawings.

The electrically conductive contact pin 100 has an overall length L in the length direction (±y direction), an overall thickness H in the thickness direction (±z direction) orthogonal to the length direction, and an overall width W in the width direction (±x direction) orthogonal to the length direction.

The electrically conductive contact pin 100 includes a first connection portion 110, a second connection portion 120, a pair of support portions 130 extending in the length direction, a boundary portion 140 extending in the width direction and having opposite sides connected to the support portions 130, a first elastic portion 150 connecting the first connection portion 110 and the boundary portion 140 to each other, and a second elastic portion 160 connecting the second connection portion 120 and the boundary portion 140 to each other.

The first elastic portion 150 has a first end connected to the first connection portion 110 and a second end connected to the boundary portion 140. The second elastic portion 160 has a first end connected to the second connection portion 120 and a second end connected to the boundary portion 140.

The first connection portion 110, the second connection portion 120, the support portions 130, the boundary portion 140, the first elastic portion 150, and the second elastic portion 160 are integrally provided. The first connection portion 110, the second connection portion 120, the support portions 130, the boundary portion 140, the first elastic portion 150, and the second elastic portion 160 are manufactured simultaneously through a plating process.

As described below, the electrically conductive contact pin 100 is formed using a mold 1000 having an inner space 1100 by filling the inner space 1100 with a metal material through electroplating. Thus, the first connection portion 110, the second connection portion 120, the support portions 130, the boundary portion 140, the first elastic portion 150, and the second elastic portion 160 are integrally manufactured to form a single body. A conventional electrically conductive contact pin is provided by separately manufacturing a barrel and a pin portion and then assembling them. However, the electrically conductive contact pin 100 according to the preferred embodiment of the present disclosure has a structural difference in that it is provided as a single body by simultaneously manufacturing the first connection portion 110, the second connection portion 120, the support portions 130, the boundary portion 140, the first elastic portion 150, and the second elastic portion 160 through the plating process.

The electrically conductive contact pin 100 has a uniform cross-sectional shape in the thickness direction. In other words, the uniform cross-sectional shape is formed by extending in the thickness direction.

A plurality of metal layers are stacked in the thickness direction of the electrically conductive contact pin 100. The plurality of metal layers include a first metal layer 101 and a second metal layer 102.

The first metal layer 101 may be made of a metal having relatively high wear resistance compared to the second metal layer 102, preferably a metal selected from: the group consisting of rhodium (Rh), platinum (Pt), iridium (Ir), palladium (Pd), Nickel (Ni), Manganese (Mn), Tungsten (W), Phosphorus (P) and an alloy of these metals; the group consisting of a palladium-cobalt (PdCo) alloy and a palladium-nickel (PdNi) alloy; or the group consisting of a nickel-phosphor (NiP) (NiPh) alloy, a nickel-manganese (NiMn), a nickel-cobalt (NiCo), and a nickel-tungsten (NiW) alloy. The second metal layer 102 may be made of a metal having relatively high electrical conductivity compared to the first metal layer 102, preferably a metal selected from the group consisting of copper (Cu), silver (Ag), gold (Au), and an alloy of these metals. However, the present disclosure is not limited thereto.

The first metal layer 101 is provided on each of a lower surface and an upper surface of the electrically conductive contact pin 100 in the thickness direction, and the second metal layer 102 is provided between the respective first metal layers 101. For example, the electrically conductive contact pin 100 may be provided by sequentially stacking the first metal layer 101, the second metal layer 102, and the first metal layer 101, and the number of stacked layers may be at least three.

The first connection portion 110 has a first end serving as a free end and a second end connected to the first elastic portion 150 so that the first connection portion is elastically movable vertically by contact pressure.

When inspecting the inspection object 400, a connection terminal 410 of the inspection object 400 is moved downwardly in contact with an upper surface of the first connection portion 110. Therefore, the first elastic portion 150 connected to the first connection portion 110 is compressively deformed. As the first connection portion 110 is moves downwardly, the first connection portion 110 is brought into contact with the support portions 130.

The first connection portion 110 is provided on each side surface thereof with a widened portion 114 recessed inwardly in the width direction. With the configuration of the widened portion 114, the first connection portion 110 and the support portions 130 are spaced apart from each other before the connection terminal 410 of the inspection object 400 makes contact with the first connection portion 110. Since the first connection portion 110 and the support portion 130 are spaced apart from each other, the first elastic portion 150 is compressively deformed more easily under application of a pressing force of the connection terminal 410. When the connection terminal 410 of the inspection object 400 is moved downwardly by a predetermined distance in contact with the first connection portion 110, the side surfaces of the first connection portion 110 are brought into contact with the support portions 130 as the gaps between the first connection portion 110 and the support portions 130 are gradually decreased. As described above, as the first elastic portion 150 is compressed by the pressing force of the connection terminal 410, the first connection portion 110 is brought into contact with the support portions 130 to form a current path.

The first connection portion 110 includes a base portion 111 connected to the first elastic portion 150, and a protruding portion 112 extending upwardly from the base portion 111. At least two protruding portions 112 may be provided.

Through the protruding portions 112, the first connection portion 110 and the connection terminal 410 make multi-contact with each other.

An upper surface of the protruding portion 112 makes close contact with a lower surface of the connection terminal 410 of the inspection object 400. The connection terminal 410 of the inspection object 400 may be provided in the form of a solder ball. In this case, an upper surface of each of the protruding portions 112 is formed to at least partially have a curvature so as to make close contact with the lower surface of the connection terminal 410 while surrounding it.

A groove 113 is provided between the two protruding portions 112. When performing a plurality of times of bringing the first connection portion 110 and the external terminal 410 into close contact with each other, particles generated from the external terminal 410 may settle on the surface of the protruding portion 112. However, as the groove 113 is formed between the two protruding portions 112 and the upper surfaces of the protruding portions 112 are inclined toward the groove 113, particles are naturally guided toward the groove 113. As a result, it is possible to minimize a phenomenon of particles accumulating on the upper surfaces of the protruding portions 112 and interfering with electrical connection.

In addition, after the first connection portion 110 is lowered and brought into close contact with the support portions 130, the configuration of the groove 113 allows ends of the two protruding portions 112 to be moved closer together, thereby allowing the protruding portions 112 to be brought into closer contact with the connection terminal 410. The groove 113 includes a first groove **113*a* located on the upper side, and a second groove 113*b* having a width smaller than the inner width of the first groove 113*a* under the first groove 113*a*. With this, the two protruding portions 112 are more easily moved closer together with respect to a bottom surface of the second groove 113*b*. In addition, a double-groove structure including the first groove 113*a* and the second groove 113*b* prevents the rigidity of the two protruding portions 112** from being reduced.

The second connection portion 120 has a first end serving as a free end and a second end connected to the second elastic portion 160 so that the second connection portion 120 is elastically movable vertically by contact pressure.

The second connection portion 120 includes a body portion 121 connected to the second elastic portion 160, and a pair of flanges 123 extending from the body portion 121 and located inside the support portions 130. The flanges 123 are brought into contact with inner surfaces of the support portions 130 as the second elastic portion 160 is compressed.

The body portion 121 is provided with a concave portion 122. Opposite sides of the concave portion 122 form contact points that protrude downwardly so that the second connection portion 120 and a connection pad 310 make multi-contact with each other.

The flanges 123 are formed to extend upwardly from opposite sides of the body portion 121 in directions parallel to the support portions 130 while being spaced apart from the support portions 130.

The flanges 123 are located between the support portions 130 and the second elastic portion 160 in the width direction.

Each of the support portions 130 includes a thin portion 134 formed at a position corresponding to each of the flanges 123, and a thick portion 133 located on the thin portion 134 and having a width larger than that of the thin portion 134. While an outer side of the support portion 130 is provided in a vertical shape because it is in close contact with an inner wall of a through-hole 210 of the support member 200, an inner side of the support portion 130 has the thin portion 134 and the thick portion 133 with different widths. The thin portion 134 is a portion whose width is relatively small compared to the thick portion 133. Due to the configuration of the thin portion 134 and the thick portion 133 on the inner side of the support portion 130, the width of the support portion 130 increases from the bottom to the top thereof. When the flange 123 is moved upwardly, the flange 123 is spaced apart from the support portion 130 at the position of the thin portion 134, and the flange 123 is brought into contact with the support portion 130 at the position of the thick portion 133.

When the second connection portion 120 is pressed by making contact with the connection pad 310 of the circuit board 300, the second elastic portion 160 is compressively deformed and the second connection portion 120 is moved upwardly thereby. Before the second connection portion 120 is moved upwardly, the second connection portion 120 is spaced apart from the support portions 130, so that the second elastic portion 160 is more easily compressively and deformed. When the second connection portion 120 is moved upwardly by a predetermined distance, the second connection portion 120 is brought into contact with the support portions 130. More specifically, before the second elastic portion 160 is compressively deformed, the flanges 123 of the second connection portion 120 are spaced apart from the thin portions 134 of the support portions 130. When the second elastic portion 160 is compressively deformed, the second connection portion 120 is moved upwardly and the flanges 123 of the second connection portion 120 are brought into contact with the thick portions 133 of the support portions. As described above, as the second elastic portion 160 is compressed, the second connection portion 120 is brought into contact with the support portions 130 to form a current path.

The support portions 130 include a first support portion 130 provided on the left side and a second support portion 130 provided on the right side. The boundary portion 140 is formed to extend in the width direction of the electrically conductive contact pin 100, and connects the first support portion 130 and the second support portion 130 to each other.

Upper sides and lower sides of the support portions 130 may be moved closer together or farther apart from each other in the width direction with respect to the boundary portion 140. With the configuration in which the upper sides and the lower sides of the support portions 130 are moved closer or farther apart in the width direction, the process of installing and replacing the electrically conductive contact pin 100 by inserting it into the through-hole 210 of the installation member 200 can be more easily achieved.

The first elastic portion 150 is provided above the boundary portion 140, and the second elastic portion 160 is provided below the boundary portion 140. The first elastic portion 150 and the second elastic portion 160 are compressed or extended with respect to the boundary portion 140. The boundary portion 140 is fixed to the first and second support portions 130*a* and 130*b* and functions to limit the movement of the first and second elastic portions 150 and 160 when the first and second elastic portions 131 and 135 are compressively deformed.

The boundary portion 140 separates a region in which the first elastic portion 150 provided and a region in which the second elastic portion 160 is provided. Therefore, foreign substances introduced from the top are blocked from flowing toward the second elastic portion 160, and foreign substances introduced from the bottom are also blocked from flowing toward the first elastic portion 150. With this, the movement of the foreign substances introduced into the support portions 130 is limited, thereby preventing the operation of the first and second elastic portions 150 and 160 from being disturbed by the foreign substances.

The first support portion 130 and the second support portion 130 are formed along the length direction of the electrically conductive contact pin 100. The first support portion 130 and the second support portion 130 are integrally connected to the boundary portion 140 extending along the width direction of the electrically conductive contact pin 100. As the first and second elastic portions 150 and 160 are integrally connected to each other through the boundary portion, the electrically conductive contact pin 100 is constructed as a single body.

Each of the first and second elastic portions 150 and 160 has a uniform cross-sectional shape in the thickness direction of the electrically conductive contact pin 100. This is possible because the electrically conductive contact pin 100 is manufactured through the plating process.

Each of the first and second elastic portions 150 and 160 is formed by repeatedly bending a plate having an actual width t in an "S" shape, and the actual width t of the plate is uniform throughout.

Each of the first and second elastic portions 150 and 160 is formed by alternately connecting a plurality of straight portions 153 and a plurality of curved portions 154. Each of the straight portions 153 connects the curved portions 154 adjacent in the left and right directions, and each of the curved portions 154 connects the straight portions 153 adjacent in the upper and lower directions. The curved portions 154 have an arc shape.

The straight portions 153 are disposed at a central portion of each of the first and second elastic portions 150 and 160, and the curved portions 154 are disposed at outer peripheral portions of each of the first and second elastic portions 150 and 160. The straight portions 153 are provided parallel to the width direction so that the curved portions 154 are more easily deformed by contact pressure.

The first and second elastic portions 150 and 160 are connected to the boundary portion 140 at the curved portions 154 of the first and second elastic portions 150 and 160. With this, the first and second elastic portions 150 and 160 maintain elasticity with respect to the boundary portion 140.

While the first elastic portion 150 requires an amount of compression sufficient to allow the first connection portion 110 of the electrically conductive contact pin 100 to make stable contact with the connection terminal 410 of the inspection object 400, the second elastic portion 160 requires an amount of compression sufficient to allow the second connection portion 120 of the electrically conductive contact pin 100 to make stable contact with the connection pad 310 of the circuit board 300. Therefore, the first elastic portion 150 and the second elastic portion 160 may have different spring coefficients from each other. For example, the first elastic portion 150 and the second elastic portion 160 may have different lengths from each other. Alternatively, the first elastic portion 150 and the second elastic portion 160 may have different width-directional dimensions from each other.

Alternatively, one second elastic portion 160 may be provided and at least two first elastic portions 150 may be provided. As illustrated in the drawings, while one second elastic portion 160 is provided, two first elastic portions 150 are provided. The first elastic portions include a first-first elastic portion 151 having a first end connected to the first connection portion 110 and a second end connected to the boundary portion 140, and a first-second elastic portion 152 disposed to be spaced apart from the first-first elastic portion 151 and having a first end connected to the first connection portion 110 and a second end connected to the boundary portion 140. In this case, the width-directional dimensions of the first-first elastic portion 151 and the first-second elastic portion 152 may be smaller than that of the second elastic section 160.

The first-first elastic portion 151 and the first-second elastic portion 152 have symmetrical shapes in the left and right directions. In other words, the first-first elastic portion 151 and the first-second elastic portion 152 are symmetrical with respect to the axis between the first-first elastic portion 151 first elastic portion 151 and the first-second elastic portion 152. With this, the first connection portion 110 may be displaced in the vertical direction more stably.

In order to prevent the electrically conductive contact pin 100 installed in the inspection device from being separated from the installation member 200, each of the support portions 130 includes a first locking portion 131 provided at the first end thereof and a second locking portion 132 provided at the second end thereof.

The first locking portion 131 prevents the electrically conductive contact pin 100 from being separated downwardly, and the second locking portion 132 prevents the electrically conductive contact pin 100 from being separated upwardly.

The first locking portion 131 includes an inclined portion 131*a* inclined upwardly in the width direction and a protruding step 131*b* protruding outwardly in the width direction. With the configuration of the inclined portion 131*a*, the electrically conductive contact pin 100 is easily inserted into the through-hole 210 of the installation member 200. In addition, with the configuration of the protruding step 131*b*, the electrically conductive contact pin 100 is prevented from being separated downwardly from the through-hole 210 after it is installed in the through-hole 210.

The second locking portion 132 protrudes outwardly in the width direction. With this, the upward movement of the electrically conductive contact pin 100 is limited.

Referring to FIG. 4, two through-holes 210 are formed in the installation member 200. Each of the through-holes 210 has a quadrangular cross-sectional shape, and the contact pin 100 also has a electrically conductive quadrangular outer shape corresponding to the cross-sectional shape of the through-holes 210.

The cross-sectional shape of the through-hole 210 and the outer shape of the electrically conductive contact pin 100 are preferably rectangular. With this, the electrically conductive contact pin 100 is prevented from being incorrectly inserted when rotated 90 degrees.

FIG. 5 is a view illustrating the electrically conductive contact pin 100 is inserted into each of the through-holes 210 of the installation member 200.

With the electrically conductive contact pin 100 inserted into the through-hole 210, when the electrically conductive contact pin 100 is pushed upwardly until the second locking portions 132 are supported on a lower surface of the installation member 200, a portion of each of the support portions 130 protrudes from an upper surface of the installation member 200. The support portion 130 is formed to have a longer length than the through-hole 210, so that at least a portion of the support portion 130 protrudes out of the through-hole 210.

Referring to FIGS. 6 to 8, before the first elastic portion 150 and the second elastic portion 160 are compressively deformed, the first connection portion 110 and the second connection portion 120 are spaced apart from the support portions 130. When the first elastic portion 150 and the second elastic portion 160 undergo compressive deformation under application of the pressing force, the first connection portion 110 and the second connection portion 120 are brought into contact with the support portions 130, thereby forming a current path connecting the first connection portion 110, each of the support portions 130, and the second connection portion 120.

In addition, when the first elastic portion 150 and the second elastic portion 160 undergo compressive deformation under application of the pressing force, the first connection portion 110 and the second connection portion 120 are brought into close contact with the inner sides of the support portions 130, thereby increasing a frictional force. A stress applied to the first elastic portion 150 and the second elastic portion 160 is dispersed through the frictional force against the support portions 130, thereby preventing the first elastic portion 150 and the second elastic portion 160 from being excessively deformed and thus improving durability.

In order to effectively cope with the test of high-frequency characteristics of the inspection object 400, the overall length L of the electrically conductive contact pin 100 has to be short. Thus, the lengths of the first and second elastic portions 150 and 160 have to also be shortened. However, when the lengths of the first and second elastic portions 150 and 160 are shortened, a problem occurs in that contact pressure increases. In order to shorten the lengths of the first and second elastic portions 150 and 160 without increasing the contact pressure, the actual width t of the plates constituting the first and second elastic portions 150 and 160 has to be small. However, when the actual width t of the plates constituting the first and second elastic portions 150 and 160 is shortened, a problem occurs in that the first and second elastic portions 150 and 160 tend to be damaged. In order to shorten the lengths of the first and second elastic portions 150 and 160 without increasing the contact pressure and prevent damage to the first and second elastic portions 150 and 160, the overall thickness H of the plates constituting the first and second elastic portions 150 and 160 has to be large.

The electrically conductive contact pin 100 according to the preferred embodiment of the present disclosure is formed such that the actual width t of the plates is small while the overall thickness H of the plates is large. In other words, the overall thickness H of the plates is configured to be large compared to the actual width t thereof. Preferably, the actual width t of the plates constituting the electrically conductive contact pin 100 is in the range of 5 μm to 15 μm, the overall thickness H thereof is in the range of 70 μm to 200 μm, and the actual width t and the overall thickness H of the plates have a ratio in the range of 1:5 to 1:30. For example, the actual width t of the plates may be substantially 10 μm, and the overall thickness H thereof may be 100 μm, so that the actual width t and the overall thickness H of the plates may have a ratio of 1:10.

With this, it is possible to shorten the lengths of the first and second elastic portions 150 and 160 while preventing damage to the first and second elastic portions 150 and 160, and it is possible for the first and second elastic portions 150 and 160 to have an appropriate contact pressure even when the lengths thereof are shortened. Furthermore, as it is possible to increase the overall thickness H of the plates constituting the first and second elastic portions 150 and 160 compared to the actual width t thereof, the resistance to moments acting in the front and rear directions of the first and second elastic portions 150 and 160 is increased, resulting in improved contact stability.

As it is possible to shorten the lengths of the first and second elastic portions 150 and 160, the overall thickness H and the overall length L of the electrically conductive contact pin 100 have a ratio in the range of 1:3 to 1:9. Preferably, the overall length L of the electrically conductive contact pin 100 is in the range of 300 μm to 2 mm, and more preferably 450 μm to 600 μm. As such, as it is possible to shorten the overall length L of the electrically conductive contact pin 100, it is possible to effectively cope with high-frequency characteristics. Also, the elastic recovery time of the first and second elastic portions 150 and 160 is shortened, thereby shortening the test time.

In addition, as the actual width t of the plates constituting the electrically conductive contact pin 100 is configured to be smaller than the overall thickness H thereof, bending resistance in the front and rear directions can be improved.

The overall thickness H and the overall width W of the electrically conductive contact pin 100 have a ratio in the range of 1:1 to 1:5. Preferably, the overall thickness H of the electrically conductive contact pin 100 is in the range of 70 μm to 200 μm, and the overall width W of the electrically conductive contact pin 100 is in the range of 100 μm to 500 μm. More preferably, the overall width W of the electrically conductive contact pin 100 is in the range of 150 μm to 400 μm. By shortening the overall width W of the electrically conductive contact pin 100 as described above, it is possible to implement a narrower pitch.

Meanwhile, the overall thickness H and the overall width W of the electrically conductive contact pin 100 may be configured to be substantially the same. Thus, it is not necessary to join a plurality of separately manufactured electrically conductive contact pins 100 in the thickness direction so that the overall thickness H and the overall width W become substantially the same. In addition, as it is possible to make the overall thickness H and the overall width W of the electrically conductive contact pin 100 substantially the same, the resistance to moments acting in the front and rear directions of the electrically conductive contact pin 100 is increased, resulting in improved contact stability. Furthermore, with the configuration in which the overall thickness H of the electrically conductive contact pin 100 is equal to or larger than 70 μm and the ratio of the overall thickness H to the overall width W thereof is in the range of 1:1 to 1:5, overall durability and deformation stability of the electrically conductive contact pin 100 can be improved and thereby contact stability with the connection terminal 410 can be improved. In addition, as the overall thickness H of the electrically conductive contact pin 100 is configured to be equal to or larger than 70 μm, current carrying capacity is improved.

A conventional electrically conductive contact pin 100 manufactured using a photoresist mold has a smaller overall thickness H compared to an overall width W. For example, in the case of the conventional electrically conductive contact pin 100, the overall thickness H may be less than 70 μm and the overall thickness H and the overall width W may have a ratio in the range of 1:2 to 1:10. Thus, the resistance to moments that deform the electrically conductive contact pin 100 in the front and rear directions by contact pressure is weak. Conventionally, in order to prevent problems occurring due to excessive deformation of the elastic portions on front and rear surfaces of the electrically conductive contact pin 100, it should be considered to additionally form a housing on the front and rear surfaces of the electrically conductive contact pin 100. However, according to the preferred embodiment of the present disclosure, an additional housing is not necessary.

Hereinafter, a method of manufacturing the electrically conductive contact pin according to the above-described preferred embodiment of the present disclosure will be described.

FIG. **9*a* is a plan view illustrating a mold 1000 in which an inner space 1100 is formed. FIG. 9*b* is a sectional view taken along line A-A' of FIG. 9*a***.

The mold 1000 may be made of an anodic aluminum oxide film, a photoresist, a silicon wafer, or a material similar thereto. However, a preferred material for the mold 1000 is the anodic aluminum oxide film. The anodic aluminum oxide film means a film formed by anodization of a metal as a base material, and pores mean holes formed in the process of forming the anodic aluminum oxide film by the anodization of the metal. For example, when the metal as the base material is aluminum (Al) or an aluminum alloy, the anodization of the base material forms the anodic aluminum oxide film consisting of anodized aluminum ($Al_2O_3$) on a surface of the base material. However, the metal as the base material is not limited thereto, and includes Ta, Nb, Ti, Zr, Hf, Zn, W, Sb, or an alloy of these metals. The resulting anodic aluminum oxide film includes a barrier layer in which no pores are formed therein vertically, and a porous layer in which pores are formed therein. After removing the base material on which the anodic aluminum oxide film including the barrier layer and the porous layer is formed, only the anodic aluminum oxide film consisting of anodized aluminum ($Al_2O_3$) remains. The anodic aluminum oxide film may have a structure in which the barrier layer formed during the anodization is removed to expose the top and bottom of the pores, or a structure in which the barrier layer formed during the anodization remains to close one of the top and bottom of the pores.

The anodic aluminum oxide film has a coefficient of thermal expansion of 2 to 3 ppm/° C. With this range, the anodic aluminum oxide film only undergoes a small amount of thermal deformation due to temperature when exposed to a high-temperature environment. Thus, even when the electrically conductive contact pin 100 is manufactured in a high-temperature environment, a precise electrically conductive contact pin 100 can manufactured without thermal deformation.

Since the electrically conductive contact pin 100 according to the preferred embodiment of the present disclosure is manufactured using the mold 1000 made of the anodic aluminum oxide film instead of a photoresist mold, there is an effect of realizing shape precision and a fine shape, which were limited in realization with the photoresist mold. In addition, when the conventional photoresist mold is used, an electrically conductive contact pin with a thickness of 40 μm can be manufactured, but when the mold 1000 made of the anodic aluminum oxide film is used, the electrically conductive contact pin 100 with a thickness in the range of 100 μm to 200 μm can be manufactured.

A seed layer 1200 is provided on a lower surface of the mold 1000. The seed layer 1200 may be provided on the lower surface of the mold 1000 before the inner space 1100 is formed in the mold 1000. Meanwhile, a support substrate (not illustrated) is formed under the mold 1000 to improve handling of the mold 1000. In this case, the seed layer 1200 may be formed on an upper surface of the support substrate, and then the mold 1000 having the inner space 1100 may be coupled to the support substrate. The seed layer 1200 may be made of copper (Cu), and may be formed by a deposition method.

The inner space 1100 may be formed by wet-etching the mold 1000 made of the anodic aluminum oxide film. To this end, a photoresist may be provided on the upper surface of the mold 1000 and patterned, and then the anodic aluminum oxide film in a patterned and open area may react with an etchant to form the inner space 1100.

Thereafter, an electroplating process is performed on the inner space 1100 of the mold 1000 to form an electrically conductive contact pin 100. FIG. **9*c* is a plan view illustrating the electroplating process performed on the inner space 1100. FIG. 9*d* is a sectional view taken along line A-A' of FIG. 9*c***.

During the electroplating process, a metal layer is formed while growing in the thickness direction of the mold 1000. Thus, the metal layer thus formed has a uniform cross-sectional shape in the thickness direction of the electrically conductive contact pin 100. A plurality of metal layers are stacked in the thickness direction of the electrically conductive contact pin 100. The plurality of metal layers include a first metal layer 101 and a second metal layer 102. The first metal layer 101 is a metal having relatively high wear resistance compared to the second metal layer 102, and may be selected from the group consisting of rhodium (Rh), platinum (Pt), iridium (Ir), palladium, and an alloy of these metals; the group consisting of a palladium-cobalt (PdCo) alloy and a palladium-nickel (PdNi) alloy; or the group consisting of a nickel-phosphor (NiP)—(NiPh) alloy, a nickel-manganese (NiMn), a nickel-cobalt (NiCo), and a nickel-tungsten (NiW) alloy. The second metal layer 102 is a metal having relatively high electrical conductivity compared to the first metal layer 101, and may be selected from the group consisting of copper (Cu), silver (Ag), gold (Au), and an alloy of these metals.

The first metal layer 101 is provided on each of a lower surface and an upper surface of the electrically conductive contact pin 100 in the thickness direction, and the second metal layer 102 is provided between the respective first metal layers 101. For example, the electrically conductive contact pin 100 may be provided by sequentially stacking the first metal layer 101, the second metal layer 102, and the first metal layer 101, and the number of stacked layers may be at least three.

Meanwhile, after the plating process is completed, the temperature is raised to a high temperature and pressure is applied to pressurize the metal layers on which the plating process is completed so that the first metal layer 101 and the second metal layer 102 are made denser. When a photoresist is used as a mold, the process of raising the temperature to a high temperature and applying pressure cannot be performed because the photoresist exists around the metal layers after the plating process is completed. On the contrary, according to the preferred embodiment of the present disclosure, since the mold 1000 made of the anodic aluminum oxide film is provided around the metal layers on which the plating process is completed, even when the temperature is raised to a high temperature, it is possible to densify the first metal layer 101 and the second metal layer 102 with minimized deformation because of the low coefficient of thermal expansion of the anodic aluminum oxide film. Thus, it is possible to obtain the first metal layer 101 and the second metal layer 102 with a higher density compared to the technique using the photoresist as a mold.

When the electroplating process is completed, the mold 1000 and the seed layer 1200 are removed. When the mold 1000 is made of the anodic aluminum oxide film, the mold 1000 is removed using a solution that selectively reacts with the anodic aluminum oxide film. In addition, when the seed layer 1200 is made of copper (Cu), the seed layer 1200 is removed using a solution that selectively reacts with copper (Cu).

Referring to FIG. 10, the electrically conductive contact pins 100 according to the preferred embodiment of the present disclosure includes a plurality of fine trenches 88 provided in a side surface thereof. The fine trenches 88 are formed to extend in the thickness direction of the electrically conductive contact pin 100 in the side surface of the electrically conductive contact pin 100. Here, the thickness direction of the electrically conductive contact pin 100 means a direction in which a metal filling material grows during electroplating.

The electrically conductive contact pin 100 is formed by alternately stacking the first metal layer 101 and the second metal layer 102. The fine trenches 88 are formed to extend continuously in the thickness direction of the electrically conductive contact pin 100 even the at interface between the first metal layer 101 and the second metal layer 102.

The fine trenches 88 have a depth in the range of 20 nm to 1 μm and a width in the range of 20 nm to 1 μm. Here, because the fine trenches 88 are resulted from the formation of the pores formed during the manufacture of the mold made of the anodic aluminum oxide film, the width and depth of the fine trenches 88 are equal to or less than the diameter of the pores formed in the mold 1000 made of the anodic aluminum oxide film. On the other hand, in the process of forming the inner space 1100 in the mold 1000 made of the anodic aluminum oxide film, portions of the pores of the mold 1000 made of the anodic aluminum oxide film may be crushed by an etchant to at least partially form a fine trench 88 having a depth greater than the diameter of the pores formed during the anodization.

Since the mold 1000 made of the anodic aluminum oxide film includes a large number of pores, at least a portion of the mold 1000 made of the anodic aluminum oxide film is etched to form the inner space 1100, and the metal filling material is formed in the inner space 1100 by electroplating, the fine trenches 88 are formed in the side surface of the electrically conductive contact pin 100 as a result of contact between the contact pin and the pores of the mold 1000 made of the anodic aluminum oxide film.

The fine trenches 88 as described above can contribute to increasing the surface area of the side surface of the electrically conductive contact pin 100. In addition, with the configuration of the fine trenches 88 formed in the side surface of the electrically conductive contact pin 100, heat generated in the electrically conductive contact pin 100 can be rapidly dissipated, thereby suppressing a rise in the temperature of the electrically conductive contact pin 100. In addition, with the configuration of the fine trenches 88 formed in the side surface of the electrically conductive contact pin 100, the torsional resistance ability of the electrically conductive contact pin 100 against deformation can be improved.

The electrically conductive contact pin 100 according to the preferred embodiment of the present disclosure described above is provided in the inspection device 10 and is used to transmit electrical signals by making electrical and physical contact with the inspection object 400.

The inspection device 10 includes the electrically conductive contact pin 100 that is inserted into the through-hole 210 of the installation member 200 and installed in the installation member 200.

The inspection device 10 may be an inspection device used in a semiconductor manufacturing process, for example, a probe card or a test socket. The electrically conductive contact pin 100 may be an electrically conductive contact pin provided in a probe card to test a semiconductor chip, or a socket pin provided in a test socket for testing a semiconductor package to test the semiconductor package. However, the inspection device 10 that can use the electrically conductive contact pin 100 according to the preferred embodiment of the present disclosure are not limited thereto, and includes any device for checking whether the inspection object is defective by applying electricity.

The inspection object 400 of the inspection device 10 may be a semiconductor device, a memory chip, a microprocessor chip, a logic chip, a light-emitting device, or a combination thereof. For example, the inspection object includes a logic LSI (such as an ASIC, an FPGA, and an ASSP), a microprocessor (such as a CPU and a GPU), a memory (such as a DRAM and a hybrid memory cube (HMC), a a phase-change memory (PCM), magnetic RAM (MRAM), a resistive RAM (ReRAM), a ferroelectric RAM (FeRAM), a flash memory (such as NAND flash), a semiconductor light-emitting device (such as an LED, a mini LED, and a micro-LED), a power device, an analog IC (such as a DC-AC converter and an insulating gate bipolar transistor (IGBT)), an MEMS (such as an acceleration sensor, a pressure sensor, a vibrator, and a gyro sensor), a wireless device (such as a GPS, an FM, an NFC, an RFEM, an MMIC, and a WLAN), a discrete device, a BSI, a CIS, a camera module, a CMOS, a passive device, a GAW filter, an RF filter, an RF IPD, an APE, and a BB.

Although the preferred embodiments of the present disclosure have been disclosed for illustrative purposes, those skilled in the art will appreciate that various modifications, additions, and substitutions are possible, without departing from the scope and spirit of the present disclosure as disclosed in the accompanying claims.

DESCRIPTION OF THE REFERENCE NUMERALS IN THE DRAWINGS

100: electrically conductive contact pin
110: first connection portion
120: second connection portion
130: support portion
140: boundary portion
150: first elastic portion
160: second elastic portion
200: installation member
300: circuit board
400: inspection object

The invention claimed is:

1. An electrically conductive contact pin, comprising:
a first connection portion;
a second connection portion;
a pair of support portions extending in a length direction;
a boundary portion extending in a width direction and having opposite sides connected to the pair of support portions;
a first elastic portion connecting the first connection portion and the boundary portion to each other; and
a second elastic portion connecting the second connection portion and the boundary portion to each other,
wherein the first connection portion is brought into contact with the pair of support portions to form a current path as the first elastic portion is compressed, and
the second connection portion is brought into contact with the pair of support portions to form a current path as the second elastic portion is compressed.

2. The electrically conductive contact pin of claim 1, wherein the second connection portion comprises a pair of flanges located inside the support portions,
wherein the flanges are brought into contact with inner sides of the support portions as the second elastic portion is compressed.

3. The electrically conductive contact pin of claim 1, wherein the first connection portion comprises:
a base portion connected to the first elastic portion; and
at least two protruding portions extending from the base portion.

4. The electrically conductive contact pin of claim 3, wherein the first connection portion further comprises a groove provided between the at least two protruding portions.

5. The electrically conductive contact pin of claim 1, wherein the first elastic portion comprises:
a first-first elastic portion having a first end connected to the first connection portion and a second end connected to the boundary portion; and
a first-second elastic portion disposed to be spaced apart from the first-first elastic portion and having a first end connected to the first connection portion and a second end connected to the boundary portion.

6. The electrically conductive contact pin of claim 5, wherein the first-first elastic portion and the first-second elastic portion have symmetrical shapes in left and right directions.

7. The electrically conductive contact pin of claim 1, wherein each of the support portions comprises:
a first locking portion provided at a first end thereof; and
a second locking portion provided at a second end thereof.

8. The electrically conductive contact pin of claim 1, wherein the electrically conductive contact pin is formed by stacking a plurality of metal layers in a thickness direction of the electrically conductive contact pin.

9. The electrically conductive contact pin of claim 1, further comprising:
a plurality of fine trenches provided in a side surface thereof.

10. An inspection device, comprising:
an electrically conductive contact pin comprising a first connection portion, a second connection portion, a pair of support portions extending in a length direction, a boundary portion extending in a width direction and having opposite sides connected to the pair of support portions, a first elastic portion connecting the first connection portion and the boundary portion to each other, and a second elastic portion connecting the second connection portion and the boundary portion to each other, wherein the first connection portion is brought into contact with the pair of support portions to form a current path as the first elastic portion is compressed, and the second connection portion is brought into contact with the pair of support portions to form a current path as the second elastic portion is compressed; and
an installation member having a through-hole receiving the electrically conductive contact pin.

11. The inspection device of claim 10, wherein each of the support portions is formed to have a longer length than the through-hole, so that at least a portion of each of the support portions protrudes out of the through-hole.

12. The inspection device of claim 10, wherein each of the support portions comprises:
a first locking portion provided at a first end thereof; and
a second locking portion provided at a second end thereof.

* * * * *